United States Patent
Bao et al.

(10) Patent No.: US 10,068,805 B2
(45) Date of Patent: Sep. 4, 2018

(54) SELF-ALIGNED SPACER FOR CUT-LAST TRANSISTOR FABRICATION

(71) Applicant: INTERNATIONAL BUSINESS MACHINES CORPORATION, Armonk, NY (US)

(72) Inventors: Ruqiang Bao, Wappingers Falls, NY (US); Dechao Guo, Niskayuna, NY (US); Zuoguang Liu, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/406,114

(22) Filed: Jan. 13, 2017

(65) Prior Publication Data

US 2018/0082905 A1    Mar. 22, 2018

Related U.S. Application Data

(62) Division of application No. 15/272,811, filed on Sep. 22, 2016, now Pat. No. 9,704,754.

(51) Int. Cl.
| | |
|---|---|
| H01L 21/8234 | (2006.01) |
| H01L 23/528 | (2006.01) |
| H01L 23/522 | (2006.01) |
| H01L 29/66 | (2006.01) |
| H01L 21/28 | (2006.01) |
| H01L 21/02 | (2006.01) |
| H01L 29/417 | (2006.01) |

(52) U.S. Cl.
CPC ........ *H01L 21/823475* (2013.01); *H01L 21/02247* (2013.01); *H01L 21/28132* (2013.01); *H01L 23/5226* (2013.01); *H01L 23/5286* (2013.01); *H01L 29/41791* (2013.01); *H01L 29/66545* (2013.01); *H01L 21/823431* (2013.01)

(58) Field of Classification Search
None
See application file for complete search history.

(56) References Cited

U.S. PATENT DOCUMENTS

| | | |
|---|---|---|
| 6,770,516 B2 | 8/2004 | Wu |
| 7,172,792 B2 | 2/2007 | Wang et al. |
| 7,476,578 B1 | 1/2009 | Cheng et al. |
| 7,579,648 B2 | 8/2009 | Yoon et al. |
| 8,174,055 B2 | 5/2012 | Bonser et al. |
| 8,716,797 B2 | 5/2014 | Basker et al. |
| 9,023,700 B2 | 5/2015 | Ganguly et al. |
| 9,171,927 B2 | 10/2015 | Mehta et al. |

(Continued)

OTHER PUBLICATIONS

Shin Yokoyama et al., Atomic-layer selective deposition of silicon nitride on hydrogen-terminated Si surfaces, Applied Surface Science 130-132, Jun. 1998, 352-356.

(Continued)

*Primary Examiner* — Khaja Ahmad
(74) *Attorney, Agent, or Firm* — Tutunjian & Bitetto, P.C.; Vazken Alexanian (57) ABSTRACT

Semiconductor devices include one or more semiconductor fins. A gate is formed over the one or more semiconductor fins. A vertical sidewall is formed at a perimeter of the gate, the vertical sidewall having a uniform thickness along its height. A power rail is formed in contact with the vertical sidewall.

19 Claims, 6 Drawing Sheets

(56) References Cited

U.S. PATENT DOCUMENTS

| | | | |
|---|---|---|---|
| 2004/0082182 A1* | 4/2004 | Blosse | H01L 21/31116 438/700 |
| 2007/0020879 A1 | 1/2007 | Baek et al. | |
| 2010/0200840 A1* | 8/2010 | Anderson | H01L 29/1606 257/29 |
| 2011/0079862 A1* | 4/2011 | Rachmady | H01L 21/76834 257/411 |
| 2011/0298061 A1* | 12/2011 | Siddiqui | H01L 21/28088 257/410 |
| 2015/0115371 A1 | 4/2015 | Ganz et al. | |
| 2015/0263131 A1* | 9/2015 | Metz | H01L 29/495 438/586 |
| 2017/0207337 A1* | 7/2017 | Chang | H01L 29/4232 |

OTHER PUBLICATIONS

List of IBM Patents or Patent Applications Treated as Related dated Jan. 13, 2017, 2 pages.

* cited by examiner

SELF-ALIGNED SPACER FOR CUT-LAST TRANSISTOR FABRICATION

BACKGROUND

Technical Field

The present invention generally relates to semiconductor device fabrication and, more particularly, to selective nitridation of a dummy gate to prevent shorting between contacts.

Description of the Related Art

When gate cut last processes are used and silicon nitride is deposited to fill the gap, problems can arise in the middle-of-line (MOL). In particular, structures are formed in the gate cut, which can be quite narrow. Existing processes form, for example, contacts and power rails in a silicon nitride filler that is in contact with the gate. When contacts are formed through this silicon nitride filler, it is possible to over-etch the material and breach the lining such that, for example, the power rail can short-circuit to the gate. This decreases device yield and device reliability.

Other structures use a silicon nitride liner around only the gate. However, this structure is generally formed using an anisotropic etch to remove excess liner material from horizontal surfaces of the device. Such an etch will remove some material from the vertical portions of the liner as well, resulting in a tapered profile and a thinner liner at the top of the gate. This thinned liner is susceptible to short circuits to, e.g., a nearby power rail.

SUMMARY

A semiconductor device includes one or more semiconductor fins. A gate is formed over the one or more semiconductor fins. A vertical sidewall is formed at a perimeter of the gate, the vertical sidewall having a uniform thickness along its height. A power rail is formed in contact with the vertical sidewall.

A semiconductor device includes one or more semiconductor fins. A vertical sidewall forms a perimeter and has a uniform thickness along its height. A gate dielectric is formed on the one or more semiconductor fins and on an inner side of the vertical sidewall. A gate is formed over the gate dielectric. A dummy gate remnant is formed directly underneath the vertical sidewall. A power rail is in contact with the vertical sidewall.

A semiconductor device includes one or more semiconductor fins. A silicon nitride vertical sidewall forms a perimeter and has a uniform thickness along its height. A high-k gate dielectric is formed on the one or more semiconductor fins and on an inner side of the vertical sidewall. A gate is formed over the gate dielectric. A silicon dioxide upper spacer is formed continuous with the vertical spacer. The upper spacer and the vertical spacer together encapsulate the gate. A silicon dioxide dummy gate remnant is formed directly underneath the vertical sidewall. A power rail is in contact with the vertical sidewall.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention make use of self-aligned nitride spacers on a dummy gate material to establish a barrier against short-circuiting the final gate structure to other contacts. In particular, the nitride spacers of the present invention are not exposed to an anisotropic etch that might cause thinning of the spacers at the top. Instead, the spacers have a roughly uniform thickness along their entire length.

Figure 1:
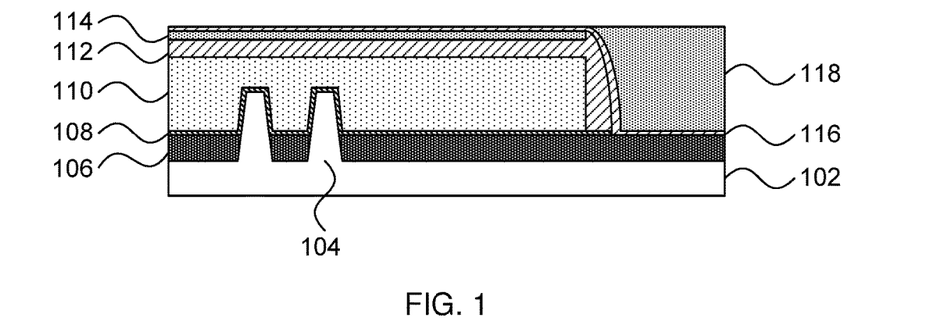
FIG. 1 is a cross-sectional view of a step in the formation of a semiconductor device in accordance with the present embodiments.

Referring now to the drawings in which like numerals represent the same or similar elements and initially to FIG. 1, a cross-sectional view of a step in forming a semiconductor device is shown. This figure shows an in-progress device, built on a semiconductor substrate 102. The semiconductor substrate 102 may be a base substrate, with no further chip layers beneath it, or may alternatively be an intermediate substrate having one or more further circuit layers underneath. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride and zinc selenide. Although not depicted herein, the semiconductor substrate 102 may also be a semiconductor on insulator (SOI) substrate.

The semiconductor substrate 102 has one or more semiconductor fins 104 formed thereon. The semiconductor fin 104 may itself be formed by any appropriate lithographic process including, e.g., a photolithographic mask and etch. A pattern is produced by applying a photoresist to the surface of the semiconductor substrate 102. The photoresist is exposed to a pattern of radiation that causes a chemical reaction within the photoresist. The pattern is then developed into the photoresist utilizing a resist developer. Once the patterning of the photoresist is completed, the sections covered by the photoresist are protected while the exposed regions are removed using a selective etching process that removes the unprotected regions. The photoresist may also be removed after patterning is complete. In one embodiment, a hardmask may be used to form the semiconductor fin 104. The mask may be formed by first depositing a dielectric hardmask material, like silicon nitride or silicon dioxide atop a layer of semiconductor layer and then applying a photoresist pattern to the hardmask material using a lithography process. The photoresist pattern is then transferred into the hardmask material using a dry etch process. Next the photoresist pattern is removed and the pattern is transferred into the semiconductor material during a selective etching process, such as reactive ion etching (RIE). The remaining mask material may be removed by a wet or dry etch.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the semiconductor fin 104 can be formed by other patterning techniques such as spacer image transfer.

A dielectric barrier layer 106 is formed on the semiconductor substrate 102 and may be formed from any appropriate insulating or dielectric material. A dummy dielectric 108 is formed conformally over the dielectric barrier layer 106 and a dummy gate 110 is formed on the dummy dielectric 108. The dummy dielectric 108 may be formed from any appropriate dielectric material including, e.g., silicon dioxide. The dummy oxide 108 should be formed from a different material from the dielectric barrier layer 106 and should have etch selectivity with respect to the dielectric barrier layer 106. It is specifically contemplated that the dummy gate 110 may be formed from polysilicon, but any appropriate material may be used in its place.

A spacer layer 112 is formed over the dummy gate 110. It is specifically contemplated that the spacer layer 112 may be formed from silicon nitride, although any other appropriate dielectric or hardmask material may be used instead. A dielectric layer 114 is formed over the spacer layer 112 from, e.g., silicon dioxide, and a liner dielectric layer 116 is formed over the dielectric layer 114 from, e.g., silicon nitride. It is specifically contemplated that the liner dielectric layer 116 may be formed from the same material as the spacer layer 112. An inter-layer dielectric 118 is formed around the liner dielectric layer 116.

The device has been polished down with, e.g., a chemical mechanical planarization (CMP) process that stops on the liner dielectric layer 116. CMP is performed using, e.g., a chemical or granular slurry and mechanical force to gradually remove upper layers of the device. The slurry may be formulated to be unable to dissolve, for example, the liner dielectric material, resulting in the CMP process's inability to proceed any farther than that layer.

Figure 2:
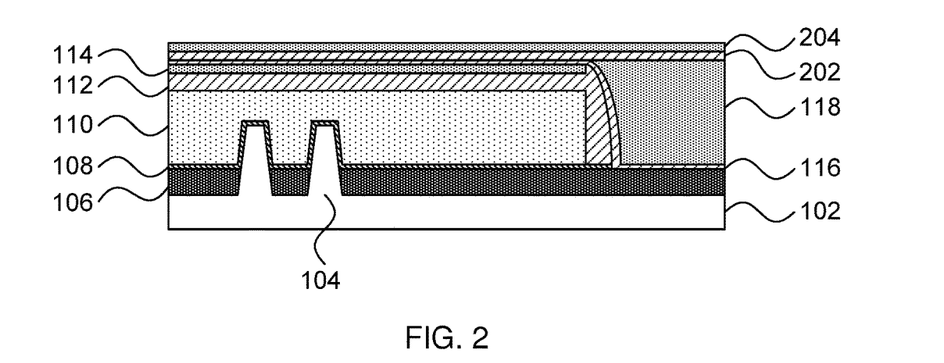
FIG. 2 is a cross-sectional view of a step in the formation of a semiconductor device in accordance with the present embodiments.

Referring now to FIG. 2, a cross-sectional view of a step in forming a semiconductor device is shown. A first mask layer 202 and a second mask layer 204 are deposited over the liner dielectric layer 116 and the inter-layer dielectric 118. It is specifically contemplated that the first mask layer 202 may be formed from the same material as the liner dielectric 118 (e.g., silicon nitride) and that the second mask layer 204 may be formed from the same material as the inter-layer dielectric 118 (e.g., silicon dioxide).

The first and second mask layers 202 and 204 may be formed by any appropriate deposition process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 3:
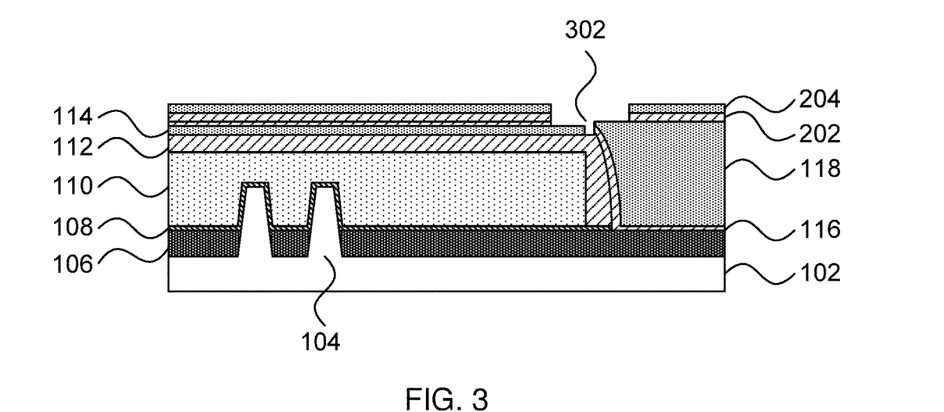
FIG. 3 is a cross-sectional view of a step in the formation of a semiconductor device in accordance with the present embodiments.

Referring now to FIG. 3, a cross-sectional view of a step in forming a semiconductor device is shown. The first and second mask layers 202 and 204 are opened to form gap 302. In particular, two separate etches may be used, with the first etch removing material from the second mask layer 204 and the first etch removing material from the first mask layer 202. The gap 302 has a stepped profile, with the opening in the first mask layer 202 being smaller than the opening in the second mask layer 204. It is specifically contemplated that the gap 302 has a width that extends past the vertical sides of the liner dielectric layer 116. The gap 302 exposes the spacer layer 112.

The etches may be performed photolithographically. In one exemplary etch, a photoresist mask is formed overlying the second mask layer 204 material. The exposed portions of the second mask layer 204, which are not protected by the photoresist mask, are removed using a selective etch process. To provide the photoresist mask, a photoresist layer is first positioned on the second dielectric layer 204. The photoresist layer may be provided by a blanket layer of photoresist material that is formed utilizing a deposition process such as, for example, CVD, PECVD, evaporation, or spin-on coating. The blanket layer of photoresist material is then patterned to provide the photoresist mask utilizing a lithographic process that may include exposing the photoresist material to a pattern of radiation and developing the exposed photoresist material utilizing a resist developer. A similar etch may be used to open the first mask layer 202.

Figure 4:
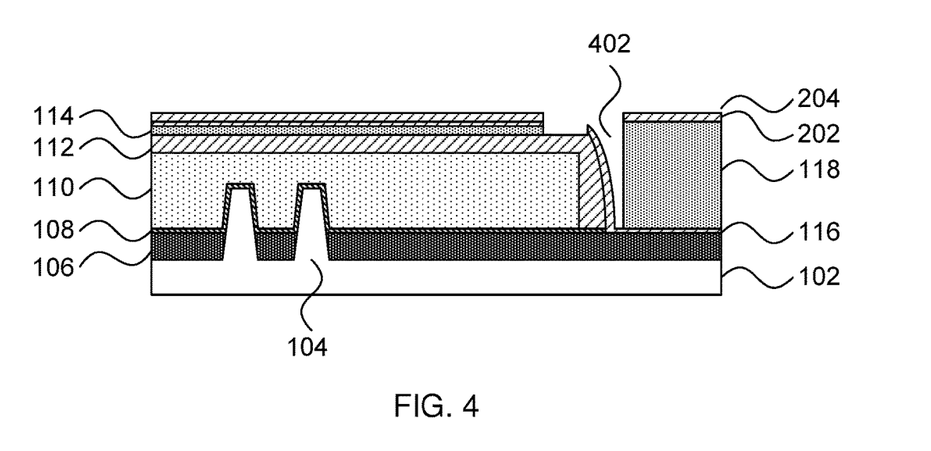
FIG. 4 is a cross-sectional view of a step in the formation of a semiconductor device in accordance with the present embodiments.

Referring now to FIG. 4, a cross-sectional view of a step in forming a semiconductor device is shown. An anisotropic etch, such as RIE, is used to remove material from dielectric layer 114 and inter-layer dielectric 118. The etch exposes more of the spacer layer 112 and exposes the side of the liner dielectric 116.

Figure 5:
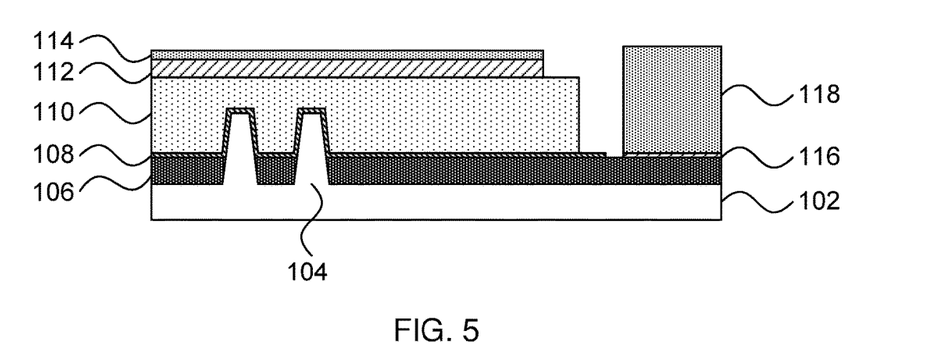
FIG. 5 is a cross-sectional view of a step in the formation of a semiconductor device in accordance with the present embodiments.

Referring now to FIG. 5, a cross-sectional view of a step in forming a semiconductor device is shown. An anisotropic etch, such as RIE, is used to remove material from the spacer layer 112 and the liner dielectric 116. The etch exposes a lateral side of the dummy gate 110.

Figure 6:
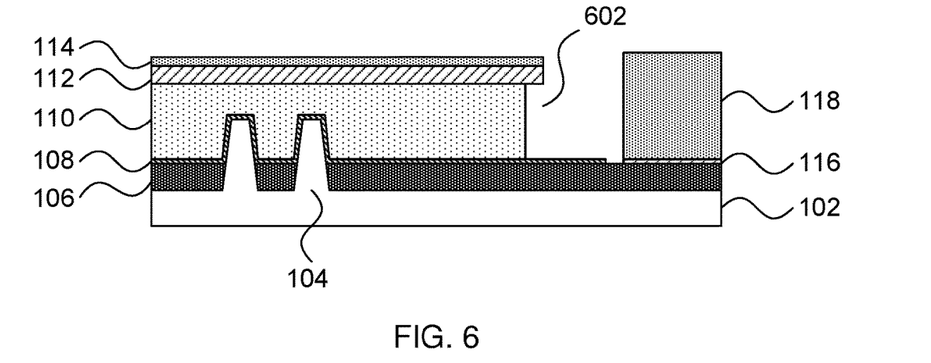
FIG. 6 is a cross-sectional view of a step in the formation of a semiconductor device in accordance with the present embodiments.

Referring now to FIG. 6, a cross-sectional view of a step in forming a semiconductor device is shown. An isotropic etch is used to remove material from the dummy gate 110. The isotropic etch may include a wet or dry chemical etch that removes the exposed material from the dummy gate 110 and furthermore etches the dummy gate 110 underneath the remaining spacer layer 112, creating an overhang 602.

Figure 7:
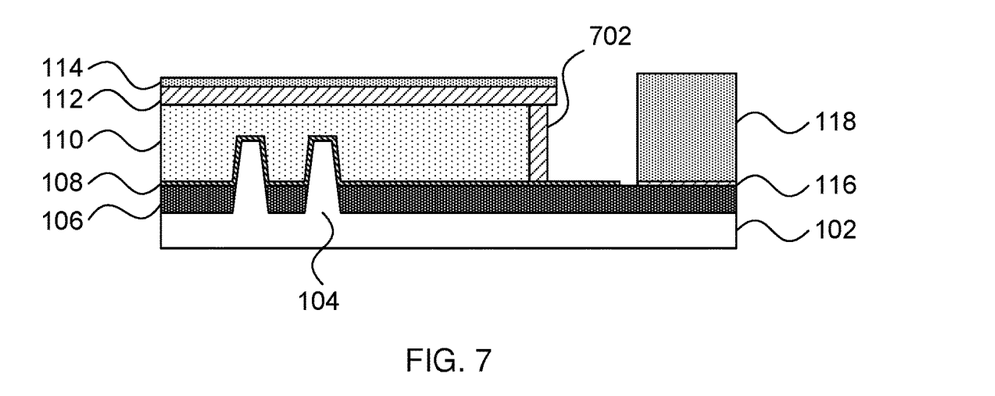
FIG. 7 is a cross-sectional view of a step in the formation of a semiconductor device in accordance with the present embodiments.

Referring now to FIG. 7, a cross-sectional view of a step in forming a semiconductor device is shown. A selective nitridation process is used to nitridize the lateral surface of the dummy gate 110 and form sidewall 702. In the case where the dummy gate 110 is formed from polysilicon, the nitridation process forms a layer of silicon nitride from the lateral surface of the dummy gate 110. It should be noted that the sidewall 702 forms around the entire dummy gate 110, including the surfaces that run parallel to the page (not shown). The sidewall 702 has a roughly uniform thickness along its entire height, and this thickness is maintained throughout the fabrication.

It is specifically contemplated that thermal nitridation may be used to form the sidewall 702. Thermal nitridation may include exposing the exposed surface of the dummy gate 110 to a nitrogen-containing gas. Examples of nitrogen-containing gases include, but are not limited to nitrogen gas, ammonia, ammonium, nitric oxide, and mixtures thereof. The nitrogen-containing gas can be pure or can be diluted with hydrogen gas or an inert gas such as helium, neon, argon, and mixtures thereof. The nitrogen concentration in the nitridizing gas may be from about 10% to about 100%, with a range of about 50% to about 80% being preferred. In one embodiment, thermal nitridation is performed at a temperature between about 50° C. and about 450° C., with a range between about 100° C. and about 300° C. being preferred. The layer of nitridation 302 varies depending on the type of nitrogen-containing gas and the temperature at which the thermal nitridation is performed. The depth of the layer of nitridation 702 may be between 50 nm and about 5 nm.

Figure 8:
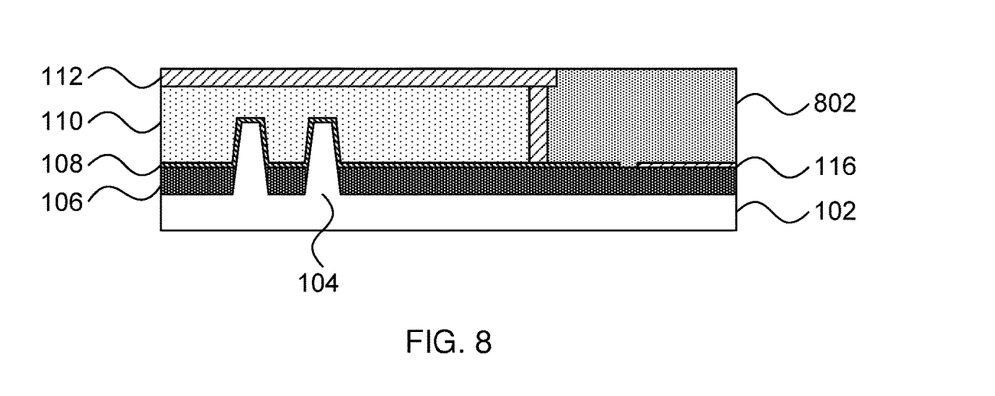
FIG. 8 is a cross-sectional view of a step in the formation of a semiconductor device in accordance with the present embodiments.

Referring now to FIG. 8, a cross-sectional view of a step in forming a semiconductor device is shown. A flowable dielectric material is deposited (e.g., the same material as is used in the inter-layer dielectric 118 and in the dielectric layer 114). It is specifically contemplated that the dielectric material may be, e.g., silicon dioxide and that the flowable oxide may be deposited in liquid form and subsequently solidified. Alternative deposition processes, such as a high-density plasma oxide deposition or CVD, may be used instead. After deposition, a CMP process is used to polish the deposited dielectric material down to the level of the spacer layer 112, forming passivating dielectric 802.

Figure 9:
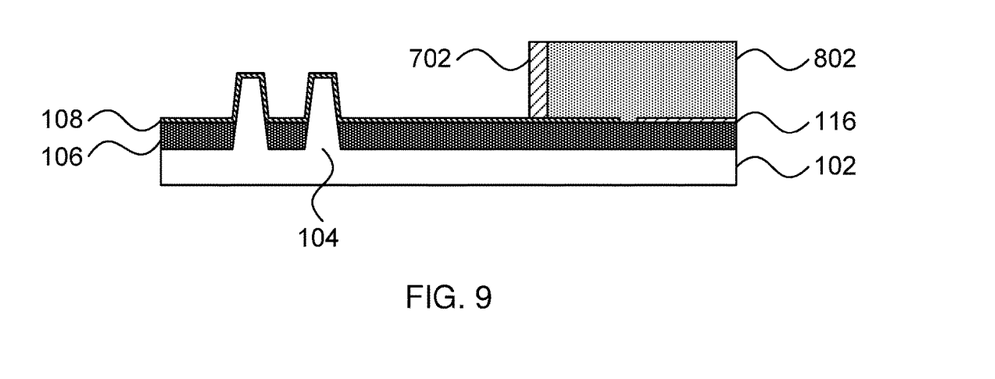
FIG. 9 is a cross-sectional view of a step in the formation of a semiconductor device in accordance with the present embodiments.

Referring now to FIG. 9, a cross-sectional view of a step in forming a semiconductor device is shown. The dummy gate 110 and the spacer layer 112 are etched away, exposing the dummy dielectric 108 and leaving the sidewall 702 in place. The spacer layer 112 is etched away using, e.g., a directional dry etch that stops when the dummy gate 110 has been exposed. This removes the spacer material from horizontal surfaces without substantially affecting the material in the vertical sidewall 702.

Figure 10:
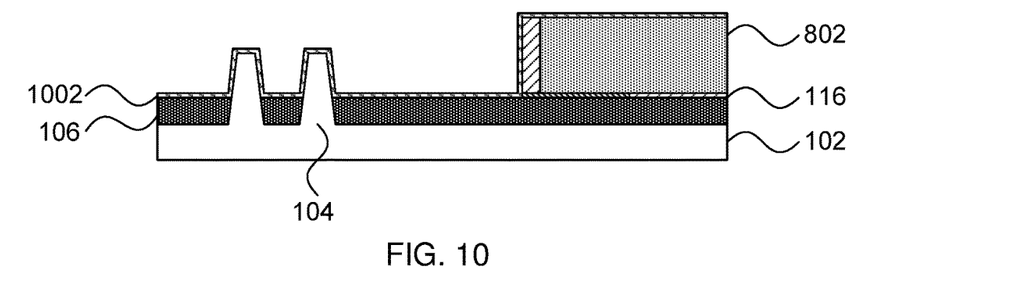
FIG. 10 is a cross-sectional view of a step in the formation of a semiconductor device in accordance with the present embodiments.

Referring now to FIG. 10, a cross-sectional view of a step in forming a semiconductor device is shown. the dummy dielectric 108 is removed using any appropriate etch and a gate dielectric layer 1002 is conformally deposited over the fins 104 using, e.g., CVD or any other appropriate deposition process. It is specifically contemplated that the gate dielectric layer 1002 may be a high-k dielectric material, which is defined to be any material having a dielectric constant higher than that of silicon dioxide. Exemplary high-k dielectric include, e.g., hafnium dioxide, zirconium dioxide, aluminum oxide, titanium dioxide, lanthanum oxide, strontium titanium oxide, lanthanum aluminum oxide, yttrium oxide, and mixtures thereof.

Figure 11:
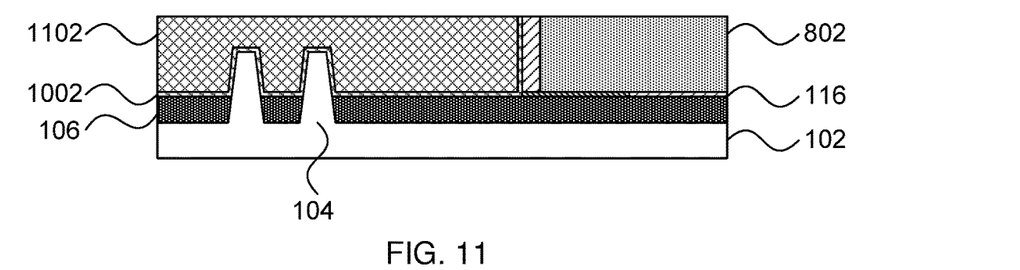
FIG. 11 is a cross-sectional view of a step in the formation of a semiconductor device in accordance with the present embodiments.

Referring now to FIG. 11, a cross-sectional view of a step in forming a semiconductor device is shown. A gate material is deposited over the gate dielectric layer 1002. The gate material may be any appropriate conductor including, e.g., tungsten, nickel, titanium, molybdenum, tantalum, copper, platinum, silver, gold, ruthenium, iridium, rhodium, rhenium, titanium nitride, titanium carbide, aluminum doped titanium carbide, alloys of any of the preceding metals, doped polysilicon and polysilicon-germanium alloy materials, and polycide materials (e.g., doped polysilicon/metal silicide stack materials). After depositing the gate material, CMP is used to polish down to the passivating layer 802 to form gate 1102.

Figure 12:
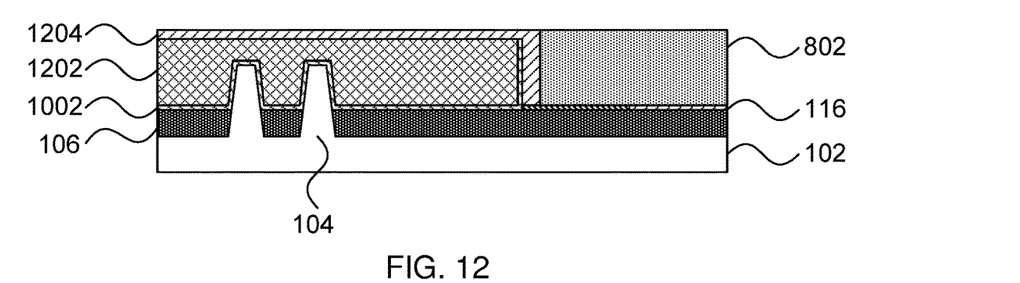
FIG. 12 is a cross-sectional view of a step in the formation of a semiconductor device in accordance with the present embodiments.

Referring now to FIG. 12, a cross-sectional view of a step in forming a semiconductor device is shown. The gate 1102 and the gate dielectric 1002 are recessed by, e.g., an RIE process to form recessed gate 1202. A layer of dielectric material (e.g., a nitride similar to the nitride of sidewall 702) is conformally deposited. The deposited dielectric material may then be polished down to the level of the passivating layer 802 to form upper spacer 1204 which may be formed continuous with the sidewall 702. The upper spacer 1204 will prevent source/drain contact trenches from shorting to the gate in the finished device.

At this stage, contacts may be formed in source/gate regions of the fins 104, which are not shown in the present figures and which are on portions of the fins 104 that are not covered by the gate 1102. Such contacts may be formed by depositing a metal on the fins 104 and forming a silicide through annealing the metal, such that the metal diffuses into the body of the fins 104.

Figure 13:
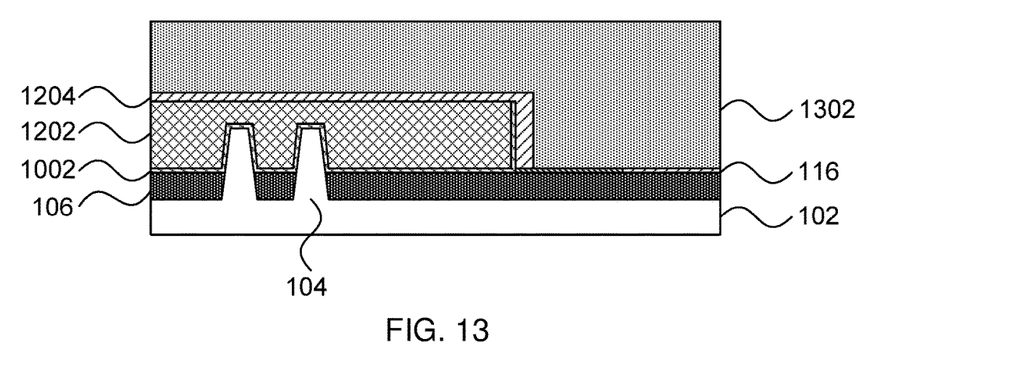
FIG. 13 is a cross-sectional view of a step in the formation of a semiconductor device in accordance with the present embodiments.

Referring now to FIG. 13, a cross-sectional view of a step in forming a semiconductor device is shown. Additional dielectric material (e.g., an oxide similar to the oxide of the passivating layer 802, such as silicon dioxide) is deposited. The additional dielectric material covers the device and forms passivating layer 1302. It should be noted that this passivating layer 1302 is formed from a material that has etch selectivity with respect to the upper spacer 1204 and sidewall 702.

Figure 14:
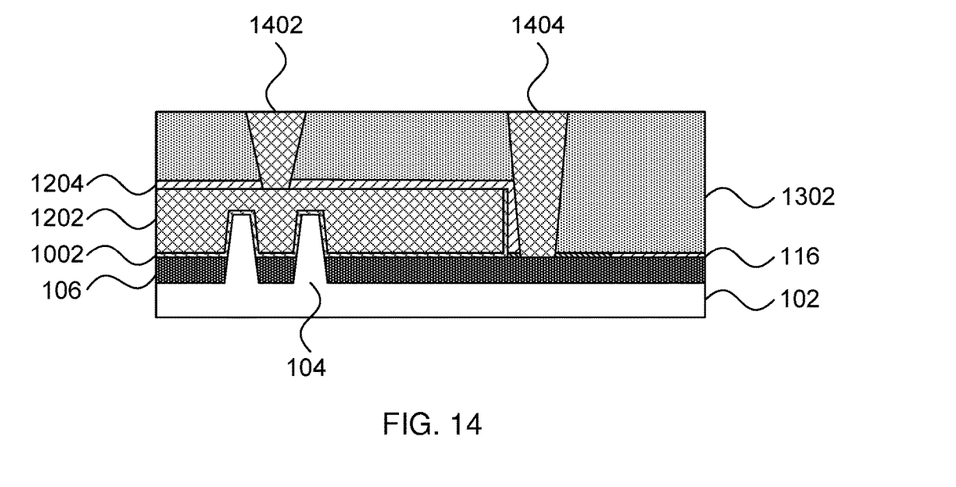
FIG. 14 is a cross-sectional view of a step in the formation of a semiconductor device in accordance with the present embodiments.

Referring now to FIG. 14, a cross-sectional view of a step in forming a semiconductor device is shown. Holes are etched into the passivating layer 1302 and conductive material (e.g., a contact metal) is deposited in the holes to form conductive contacts. A first contact 1402 is shown as contacting the gate 1202, while a second conductive contact 1404 may be used as a power rail. The holes may be formed by any appropriate anisotropic etch such as, e.g., RIE.

It should be noted that the different materials of the sidewalls 702 (as well as the upper spacer 1204) and the passivating layer 1302 makes it possible to cleanly etch the holes in the passivating layer 1302 without risk of over-etching, thereby preventing shorts between the contacts 1402/1404 and the gate 1202. In one specific embodiment, the sidewall 702 and upper spacer 1204 are formed from silicon nitride and the passivating layer is formed from silicon dioxide. Notably, the second conductive contact 1404 may be formed quite close to the gate 1202 but, due to the uniform thickness of sidewall 702, the likelihood of a short-circuit is significantly decreased.

As noted above, the sidewall 702 runs along the perimeter of the gate 1202, including on sides that run parallel to the page (not shown). The presence of the sidewall also helps prevent short-circuits between source/drain contacts (not shown) and the gate contact 1402.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 15:
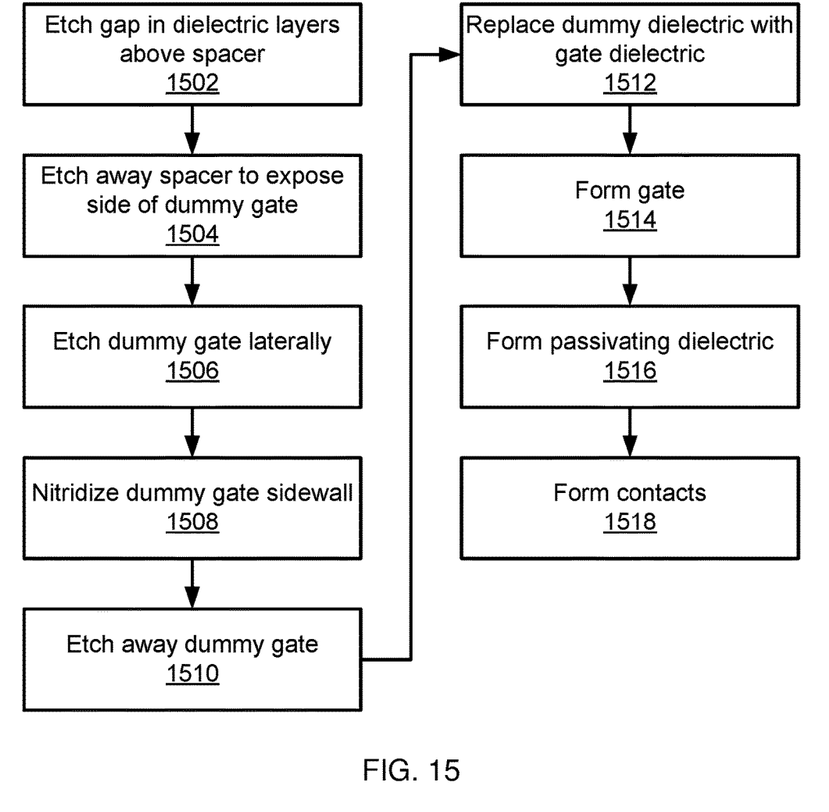
FIG. 15 is a block/flow diagram of a method of forming a semiconductor device in accordance with the present embodiments.

Referring now to FIG. 15, a method for forming a semiconductor device is shown. Block 1502 etches a gap 302 in the upper dielectric layers 202 and 204 above the sidewall spacer of dummy gate 110. Block 1504 then anisotropically etches away the dielectric material (e.g., using RIE) below the gap 302 to expose the side of the dummy gate 110. Block 1506 etches the dummy gate 110 laterally using an isotropic etch (e.g., a wet or dry chemical etch) such that spacer layer 112 overhangs the dummy gate 110.

Block 1508 nitridizes the sidewall of the dummy gate 110, forming nitridized sidewall 702. Block 1510 then etches away the dummy gate 110, leaving the nitridized sidewall intact. A dummy gate dielectric 108 is replaced by a final gate dielectric layer 1002 formed from, e.g., a high-k dielectric material in block 1512, and a gate 1102 is formed over the gate dielectric layer 1002 in block 1514. Block 1516 forms passivating dielectric layer 1302 over the gate, with block 1518 forming contacts through the passivating dielectric layer 1302. The contacts are prevented from short-circuiting to other components on the device by the sidewall spacer 702.

Having described preferred embodiments of a self-aligned spacer for cut-last transistor fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
one or more semiconductor fins;
a gate formed over the one or more semiconductor fins;
a gate dielectric formed underneath the gate and on sidewalls of the gate;
a dummy gate dielectric remnant formed adjacent to the gate dielectric;
a vertical sidewall at a perimeter of the gate dielectric and on the dummy gate dielectric remnant, the vertical sidewall having a uniform thickness along its height;
an upper spacer is on the gate dielectric having a top surface coplanar with a top surface of the vertical sidewalls;
a passivating layer formed over and around the vertical sidewall and the gate; and
a power rail in contact with the vertical sidewall.

2. The semiconductor device of claim 1, wherein the vertical sidewall is formed from silicon nitride.

3. The semiconductor device of claim 2, wherein there is no silicon nitride on horizontal surfaces around a base of the vertical sidewall.

4. The semiconductor device of claim 1, wherein the gate dielectric is formed between the gate and the one or more semiconductor fins.

5. The semiconductor device of claim 1, wherein the gate dielectric and the dummy gate dielectric remnant are formed from different materials.

6. The semiconductor device of claim 5, wherein the gate dielectric is formed from a high-k dielectric material and wherein the dummy gate dielectric remnant is formed from silicon dioxide.

7. The semiconductor device of claim 1, the upper spacer that is formed continuous with, and from a same material as, the vertical sidewall.

8. The semiconductor device of claim 7, wherein the upper spacer and the vertical sidewall together encapsulate the gate.

9. The semiconductor device of claim 7, further comprising a gate contact that pierces the upper spacer to make electrical contact with the gate.

10. A semiconductor device, comprising:
one or more semiconductor fins;
a vertical sidewall forming a perimeter and having a uniform thickness along its height;
a gate dielectric formed on the one or more semiconductor fins and on an inner side of the vertical sidewall;
a gate formed over the gate dielectric;
a dummy gate dielectric remnant formed directly underneath the vertical sidewall, adjacent to the gate dielectric;
an upper spacer is on the gate dielectric having a top surface coplanar with a top surface of the vertical sidewalls;
a passivating layer formed over and around the vertical sidewall and the gate;
and a power rail in contact with the vertical sidewall.

11. The semiconductor device of claim 10, wherein the vertical sidewall is formed from silicon nitride.

12. The semiconductor device of claim 11, wherein there is no silicon nitride on horizontal surfaces around a base of the vertical sidewall.

13. The semiconductor device of claim 10, wherein the gate dielectric and the dummy gate dielectric remnant are formed from different materials.

14. The semiconductor device of claim 13, wherein the gate dielectric is formed from a high-k dielectric material and wherein the dummy gate dielectric remnant is formed from silicon dioxide.

15. The semiconductor device of claim 10, the upper spacer that is formed continuous with, and from a same material as, the vertical sidewall.

16. The semiconductor device of claim 15, wherein the upper spacer and the vertical sidewall together encapsulate the gate.

17. The semiconductor device of claim 15, further comprising a gate contact that pierces the upper spacer to make electrical contact with the gate.

18. A semiconductor device, comprising:
one or more semiconductor fins;
a silicon nitride vertical sidewall forming a perimeter and having a uniform thickness along its height;
a high-k gate dielectric formed on the one or more semiconductor fins and on an inner side of the silicon nitride vertical sidewall;
a gate formed over the gate dielectric;

a silicon dioxide upper spacer that is formed continuous with the silicon nitride vertical sidewall, wherein an upper surface of the silicon dioxide upper spacer is coplanar with an upper surface of the silicon nitride vertical sidewalls, and the silicon dioxide upper spacer and the silicon nitride vertical sidewall together encapsulate the gate;

a silicon dioxide dummy gate dielectric remnant formed directly underneath the silicon nitride vertical sidewall and adjacent to the high-k gate dielectric;

a passivating layer formed over and around the silicon nitride vertical sidewall and the gate; and a power rail in contact with the silicon nitride vertical sidewall.

19. The semiconductor device of claim 18, wherein there is no silicon nitride on horizontal surfaces around a base of the vertical sidewall.

* * * * *